(12) United States Patent
Suzuki et al.

(10) Patent No.: US 8,598,918 B2
(45) Date of Patent: Dec. 3, 2013

(54) DIFFERENTIAL COMMUNICATION DEVICE

(75) Inventors: Youichirou Suzuki, Nishio (JP); Noboru Maeda, Chiryu (JP); Yasuhiro Fukagawa, Obu (JP); Takahisa Koyasu, Chita (JP); Masakiyo Horie, Gamagori (JP); Tomohisa Kishigami, Obu (JP)

(73) Assignees: Nippon Soken, Inc., Nishio (JP); DENSO CORPORATION, Kariya (JP)

( * ) Notice: Subject to any disclaimer, the term of this patent is extended or adjusted under 35 U.S.C. 154(b) by 84 days.

(21) Appl. No.: 13/097,229

(22) Filed: Apr. 29, 2011

(65) Prior Publication Data

US 2011/0285424 A1 Nov. 24, 2011

(30) Foreign Application Priority Data

May 20, 2010 (JP) ................. 2010-116612

(51) Int. Cl.
*H03B 1/00* (2006.01)
*H03K 3/00* (2006.01)

(52) U.S. Cl.
USPC .......................... 327/108; 327/112

(58) Field of Classification Search
USPC ............. 327/108, 112, 309–314, 379, 381; 361/56, 90, 91.1, 92; 326/26, 27
See application file for complete search history.

(56) References Cited

U.S. PATENT DOCUMENTS

| | | | |
|---|---|---|---|
| 5,892,717 A | 4/1999 | Malarsie | |
| 5,949,825 A | 9/1999 | Naffziger | |
| 6,285,209 B1 | 9/2001 | Sawai | |
| 6,326,803 B1 | 12/2001 | Takeda | |
| 7,312,626 B2 * | 12/2007 | Forbes | ............................ 326/26 |
| 7,528,643 B2 * | 5/2009 | Kimura | ......................... 327/310 |
| 8,098,084 B2 * | 1/2012 | Suzuki et al. | ................... 326/86 |
| 2006/0066358 A1 | 3/2006 | Tamai | |

FOREIGN PATENT DOCUMENTS

| | | |
|---|---|---|
| JP | A-2006-060505 | 3/2006 |
| JP | A-2009-253498 | 10/2009 |

OTHER PUBLICATIONS

Decision of Refusal mailed Nov. 20, 2012 issued from the Japanese Patent Office in the corresponding Japanese patent application No. 2010-116612 (with English translation).
Office Action mailed Jul. 3, 2012 in corresponding JP Application No. 2010-116612 (and English translation).

\* cited by examiner

*Primary Examiner* — Lincoln Donovan
*Assistant Examiner* — Diana J Cheng
(74) *Attorney, Agent, or Firm* — Posz Law Group, PLC (57) ABSTRACT

When a transmission signal is detected as having been changed from a high level to a low level, two transmission lines are connected for only a predetermined time through a diode by a first transistor and a second transistor. The diode is arranged such that its forward direction is from a high-side transmission line to a low-side transmission line. The diode turns on, when a potential of the high-side transmission line becomes higher than that of the low-side transmission line by ringing and a potential difference therebetween exceeds a forward drop voltage of the diode. As a result, a peak wave level of a positive side in the ringing is limited to the forward drop voltage of the diode.

9 Claims, 6 Drawing Sheets

DIFFERENTIAL COMMUNICATION DEVICE

CROSS REFERENCE TO RELATED APPLICATION

This application is based on and incorporates herein by reference Japanese Patent Application No. 2010-116612 filed on May 20, 2010.

FIELD OF THE INVENTION

The present invention relates to a differential communication device, which switches over a signal level of a transmission signal to either a high level or a low level in accordance with a potential difference between two transmission lines.

BACKGROUND OF THE INVENTION

One example of differential communication devices is known by the following patent document 1. The communication device disclosed in the patent document 1 has a terminal end portion and a communication completion detection portion, which are connected between two transmission lines. The terminal end portion includes a series circuit of a resistor and a capacitor. The communication completion detection portion detects completion of communication with other devices. When the communication completion detection portion detects the completion of communication, it connects the two transmission lines through the terminal end portion for a predetermined period from the completion of communication. Ringing is thus suppressed from arising on the transmission lines at the time of completion of communication.

According to a communication device disclosed in patent document 2, a diode is arranged between a positive-side output terminal and a negative-side output terminal of a transmission-side ECU, which are connected to two transmission lines, respectively. The diode is arranged so that its forward direction is from the negative-side output terminal to the positive-side output terminal. Ringing is thus reduced by shorting and suppressing a signal voltage changing in the negative direction by the diode.

PRIOR ART DOCUMENT

Patent document 1: JP 2009-253498A
Patent document 2: JP 2006-101430A (US 2006/0066358 A1)

Although the communication device according to the patent document 1 suppresses the ringing by using the terminal end portion, which is formed of the series circuit of the resistor and the capacitor, the series circuit of the resistor and the capacitor cannot ensure suppression of ringing to a desired peak level.

The communication device according to the patent document 2 suppresses the first signal change in the negative direction of the ringing by the diode based on that the ringing starts first in the negative direction immediately after the signal transmission has been switched over from on-level to off-level. This communication device thus suppresses a signal change, which arises in the positive direction following the first signal change in the negative direction. However, limitation of the signal change in the negative direction of the ringing to a level corresponding to a forward voltage drop of the diode is not sufficient. That is, the signal change in the positive direction cannot be suppressed sufficiently. As shown in a waveform diagram of ringing vibration in the patent document 2, the signal change in the positive direction exceeds an output voltage level, at which signal transmission is turned on. If the change in the ringing in the positive direction thus becomes higher than the output voltage level, at which the transmission signal is turned on, a receiver side is likely to detect the signal level erroneously. This will cause communication error.

The patent document 2 further discloses another example, in which a Zener diode is connected in parallel to the diode in addition thereby to suppress the change in the positive direction. Even in this example, it is necessary to provide the Zener diode not to impede generation of the output voltage when the signal is transmitted. A Zener voltage of the Zener diode is therefore set to be greater than the output voltage, at which the transmission signal is turned on. It is thus impossible to suppress the signal change of ringing in the positive direction to be less than the output voltage, at which the transmission signal is turned on surely.

SUMMARY OF THE INVENTION

It is therefore an object of the present invention to provide a differential communication device capable of suppressing positive amplitude of ringing, which arises after a transmission signal has switched over from a high level to a low level, to a predetermined peak level lower than the high level of the transmission signal.

According to one aspect of the present invention, a differential communication device is provided for switching over a level of a transmission signal to either a high level or a low level in accordance with a potential difference between two transmission lines. The differential communication device comprises a communication circuit and a ringing suppression circuit. The communication circuit is connected to the transmission lines and includes at least one of a transmitter circuit for transmitting the transmission signal and a receiver circuit for receiving the transmission signal. The ringing suppression circuit is connected to the transmission lines in parallel to the communication circuit.

The ringing suppression circuit includes a first control circuit, a switch circuit and a drive signal output circuit. The first control circuit is provided in a connection line connecting the two transmission lines and includes a first diode, which is arranged such that a forward direction thereof is from a high-side transmission line of the two transmission lines to a low-side transmission line of the two transmission lines. The high-side transmission line and the low-side transmission line provide a relatively high potential and a relatively low potential in case of transmission of a high level signal, respectively. The switch circuit is provided in the connection line in a series relation with the first diode. The drive signal output circuit outputs a drive signal, which turns on the switch circuit for only a predetermined time, upon detection of a change of the transmission signal from the high level to the low level.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENT

A differential communication device according to embodiments of the present invention will be described below with reference to the drawings.

First Embodiment

A differential communication device according to a first embodiment is applied to a communication network, which is provided to exchange data among a plurality of in-vehicle ECUs mounted in a vehicle, for example.

Figure 1:
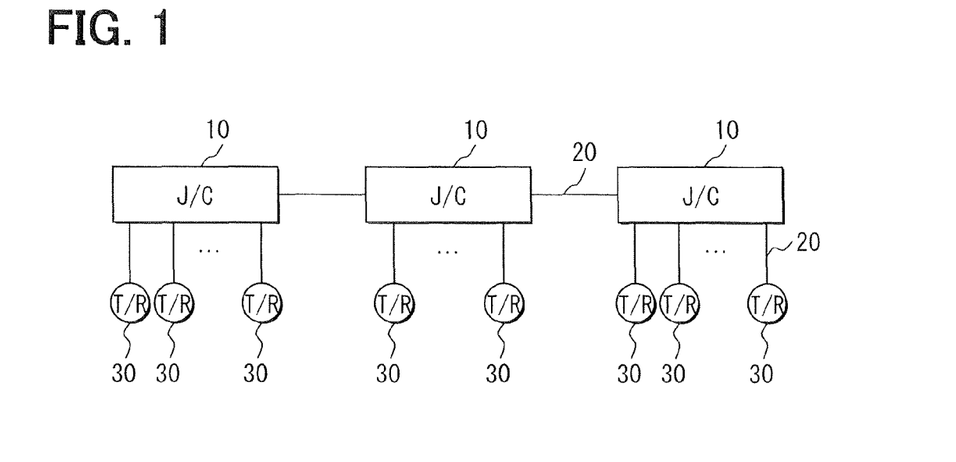
FIG. 1 is a block diagram showing a first embodiment of a differential communication device applied to a communication network.

As shown in FIG. 1, a number of transmission/reception nodes 30 are provided as differential communication devices in a communication network. Each transmission/reception node 30 is connected to be capable of communication mutually through junction connectors 10 and transmission lines 20. When one node of a plurality of transmission/reception nodes 30 starts transmission of a signal by a transmitter circuit, the other transmission/reception nodes 30 receive by respective receiver circuits the transmission signal transmitted through the junction connectors 10 and the transmission lines 20.

Figure 2:
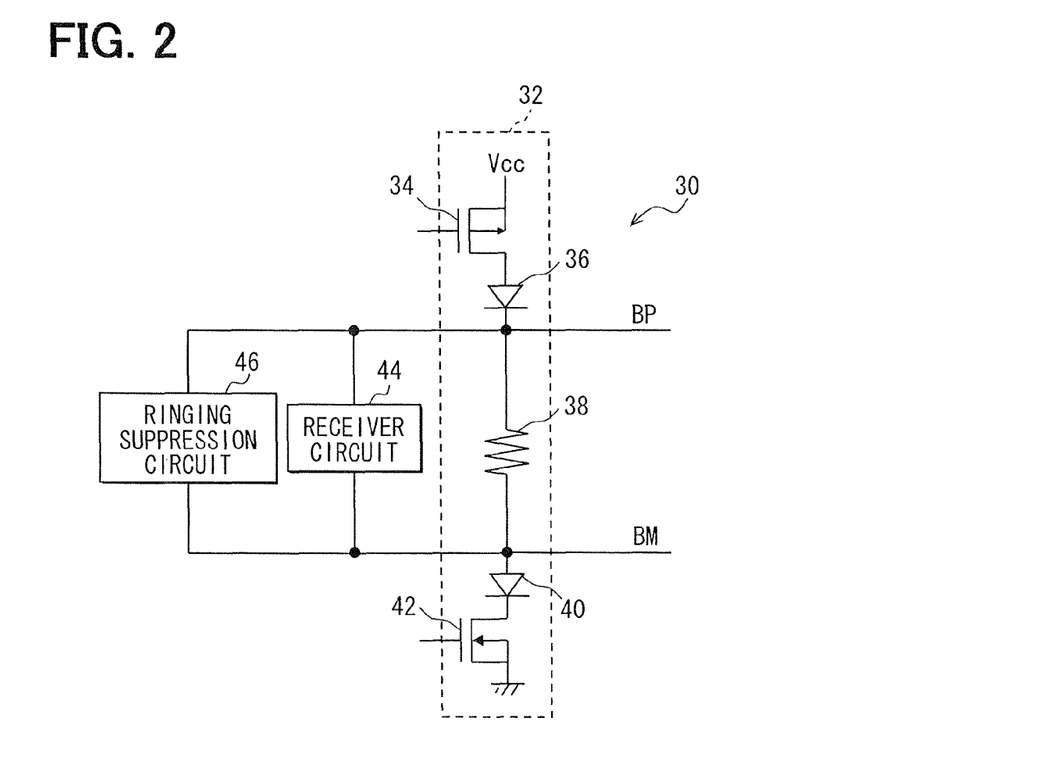
FIG. 2 is a circuit diagram showing each transmission/reception node shown in FIG. 1.

Each transmission/reception node 30 is configured as shown in FIG. 2. The differential communication device is configured to switch over the transmission signal to either a high level or a low level in accordance with a potential difference between two transmission lines, a high-potential side transmission line (hereinafter high-side transmission line) BP and a low-potential side transmission line (herein after low-side transmission line) BM. The high-side transmission line BP and the low-side transmission line BM are a positive potential-side transmission line and a negative potential-side transmission line. A transmitter circuit 32, which is one example of a communication circuit, therefore has a high potential-side MOS transistor (hereinafter high-side transistor) 34 and a low potential-side MOS transistor (hereinafter low-side transistor) 42. The high-side transistor 34 switches over a potential of the high-side transmission line BP to a relatively high potential when a high level signal is transmitted. The low-side transistor 42 switches over a potential of the low-side transmission line BM to a relatively low potential, which is lower than the high potential, when the high level signal is transmitted. For setting the transmission signal to the high level, both the high-side transistor 34 and the low-side transistor 42 are turned on. For setting the transmission signal to the low level, both the high-side transistor 34 and the low-side transistor 42 are turned off. The high-side transistor 34 and the low-side transistor 42 are turned on or off by an ECU (not shown), which transmits data.

An output terminal of the high-side transistor 34 is connected to the high-side transmission line BP through a rectifier diode 36. By turning on or off the high-side transistor 34, the potential of the high-side transmission line BP is switched to the high potential, for example Vcc, or other potentials close to Vcc. An output terminal of the low-side transistor 42 is connected to the low-side transmission line BM through a rectifier diode 40. By turning on or off the low-side transistor 42, the potential of the low-side transmission line BM is switched to the low potential, for example 0, or other potentials close to 0. When the potential of the high-side transmission line BP becomes high and the potential of the low-side transmission line BM becomes low, the difference between the potentials of the transmission lines BP and BM increases and the transmission signal level (level of signal transmitted by the transmission lines BP and BM) becomes high.

The high-side transmission line BP and the low-side transmission line BM are connected via a resistor 38. When the high-side transistor 34 and the low-side transistor 42 are both turned off, the difference between the potentials of the high-side transmission line BP and the low-side transmission line BM decreases to 0 or close to 0. The signal level of the transmission signal thus becomes low.

A receiver circuit 44, which is also an example of the communication circuit, is connected between the high-side transmission line BP and the low-side transmission line BM to receive signals, which are transmitted from other transmitter circuits 32 in the other transmission/reception nodes 30. That is, the receiver circuit 44 detects the potential difference between the high-side transmission line BP and the low-side transmission line BM and detects the level of the transmission signal.

A ringing suppression circuit 46 is provided between the high-side transmission line BP and the low-side transmission line BM in parallel to the transmitter circuit 32 and the receiver circuit 44. The ringing suppression circuit 46 is provided to suppress ringing of potential, that is, a cyclic variation or fluctuation in positive and negative directions in the potential difference, which is caused by impedance mismatching of the transmission lines BP and BM when the level of the transmission signal is switched from the high level to the low level. The ringing suppression circuit 46 may be provided in all of the transmission/reception nodes 30 or only in specified transmission/reception nodes 30.

Figure 3:
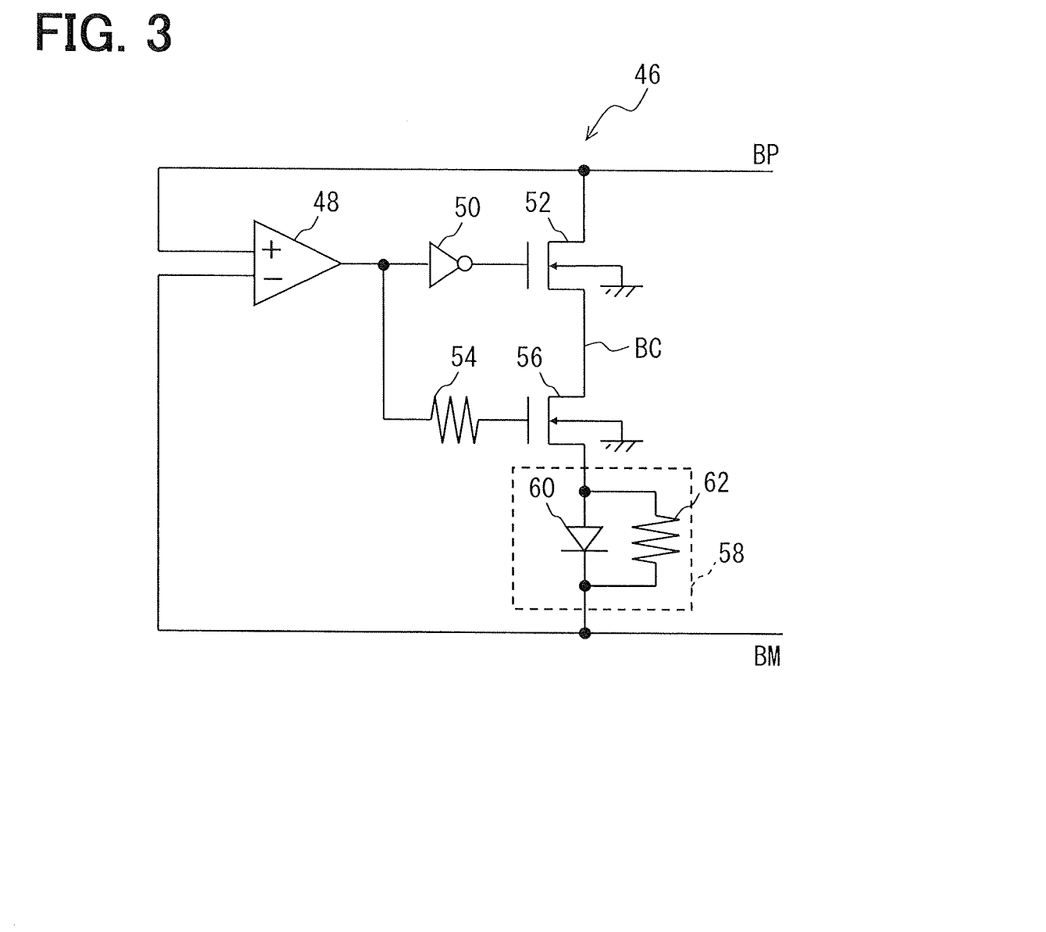
FIG. 3 is a circuit diagram of a ringing suppression circuit in the first embodiment.

The ringing suppression circuit 46 is configured as shown in FIG. 3. The ringing suppression circuit 46 includes a drive signal output circuit, which includes a comparator circuit 48, an inverter circuit 50 and a resistor 54. The comparator circuit 48 compares the potential of the high-side transmission line BP and the potential of the low-side transmission line BM. The comparator circuit 48 outputs a high level signal as a drive signal when the potential of the high-side transmission line BP is higher than that of the low-side transmission line BM. The comparator circuit 48 outputs a low level signal as a drive signal when the potential of the low-side transmission line BM is higher than that of the high-side transmission line BP.

Normally, the potential of the low-side transmission line BM does not exceed the potential of the high-side transmission line BP. However, when the level of the transmission signal changes from the high level to the low level, ringing may arise as exemplified in FIG. 5. When the ringing develops a change in the negative direction, the potential of the low-side transmission line BM transiently rises to be higher than that of the high-side transmission line BP. Thus, change in the output signal of the comparator circuit 48 from a high level signal to a low level signal indicates that the level of the transmission signal has changed from the high level to the low level and the ringing arose. The comparator circuit 48 thus operates as a detection circuit for detecting ringing.

When the comparator circuit 48 once generates the low level signal by determining that the potential of the low-side transmission line BM exceeded the potential of the high-side transmission line BP, the comparator circuit 48 maintains outputting the low level signal unless the potential of the high-side transmission line BP becomes higher than the potential of the low-side transmission line BM by more than a predetermined voltage. The comparator circuit 48 thus has hysteresis function in comparing the potential of the high-side transmission line BP and the potential of the low-side transmission line BM. The magnitude of the hysteresis (magnitude of the predetermined voltage) is set to be greater than a forward drop voltage of a diode 60 of a first impedance control circuit (hereinafter first control circuit) 58.

The output signal of the comparator circuit 48 is applied to a gate of a first MOS transistor (hereinafter first transistor) 52, which is a first switching element, through the inverter circuit 50. The output signal of the comparator circuit 48 is also applied to a gate of a second MOS transistor (hereinafter second transistor) 56, which is a second switching element, through a resistor 54. The first transistor 52 and the second transistor 56 are connected in series in a connection line BC, which connects the high-side transmission line BP and the low-side transmission line BM. The first transistor 52 and the second transistor 56 form a first switching circuit and a second switching circuit, respectively.

When the high level signal is being outputted from the comparator circuit 48, the output level is inverted to the low level signal by an inverter circuit 50. As a result, the first transistor 52 turns off and only the second transistor 56 turns on. When the output signal of the comparator circuit 48 changes from the high level to the low level, the high level signal, which is inverted from the low level signal by the inverter circuit 50, is applied instantly to the gate of the first transistor 52. As a result, the first transistor 52 turns on. The low level signal produced from the comparator circuit 48 is applied to a gate of the second transistor 56 with a predetermined time delay by a delay operation of the resistor 54. The resistor 54 thus operates as a delay circuit. As the delay circuit, an even number of series-connected inverters, a RC circuit or a LC circuit may be used in place of the resistor 54.

While the low level signal, which is to be applied to the gate of the second transistor 56, is being delayed, the gate potential of the second transistor 56 is maintained at the high level. When the output signal of the comparator circuit 48 is switched from the high level to the low level, that is, when the ringing occurs, the first transistor 52 and the second transistor 56 are turned on.

The first control circuit 58 is connected in series with the first transistor 52 and the second transistor 56 in the connection line BC connecting the high-side transmission line BP and the low-side transmission line BM. Therefore, when the first transistor 52 and the second transistor 56 are turned on at the same time because of the ringing, the high-side transmission line BP and the low-side transmission line BM are connected through the first control circuit 58.

Figure 4:
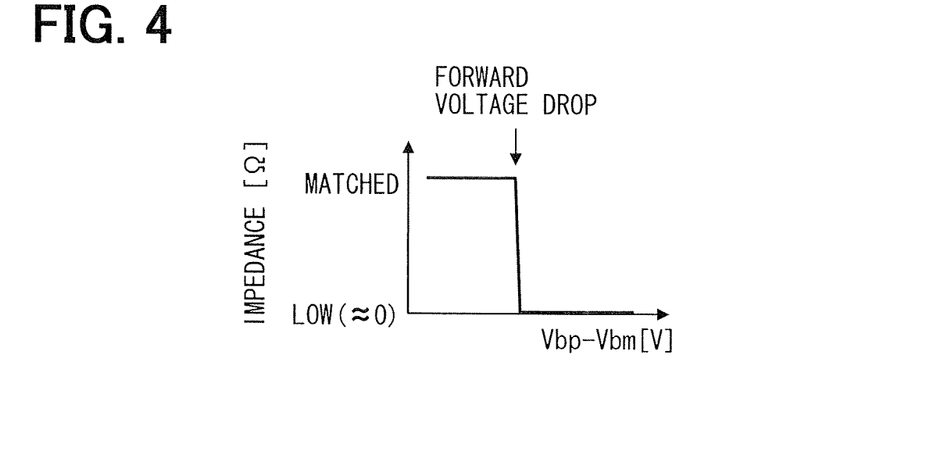
FIG. 4 is a characteristic graph showing an impedance of an impedance control circuit, which performs conversion in accordance with a potential difference between a high-side transmission line and a low-side transmission line.

The first control circuit 58 includes a first diode 60 and a first resistor 62. The diode 60 is arranged such that its forward direction is from the high-side transmission line BP to the low-side transmission line BM. That is, the diode 60 is forward-biased in a direction from the high-side transmission line BP to the low-side transmission line BM to allow current flow only in the forward direction from the high-side transmission line BP to the low-side transmission line BM. The resistor 62 is connected in parallel to the diode 60. Even when a change arises in the negative direction of the ringing, that is, the potential of the low-side transmission line BM becomes higher than that of the high-side transmission line BP, and a change in the positive direction of the ringing arises, the impedance of the first control circuit 58 becomes equal to the matching impedance of the resistor 62 as shown in FIG. 4 as long as the potential difference between the potential of the high-side transmission line BP and the potential of the low-side transmission line BM is less than the voltage drop of the diode 60 in the forward direction.

Figure 5:
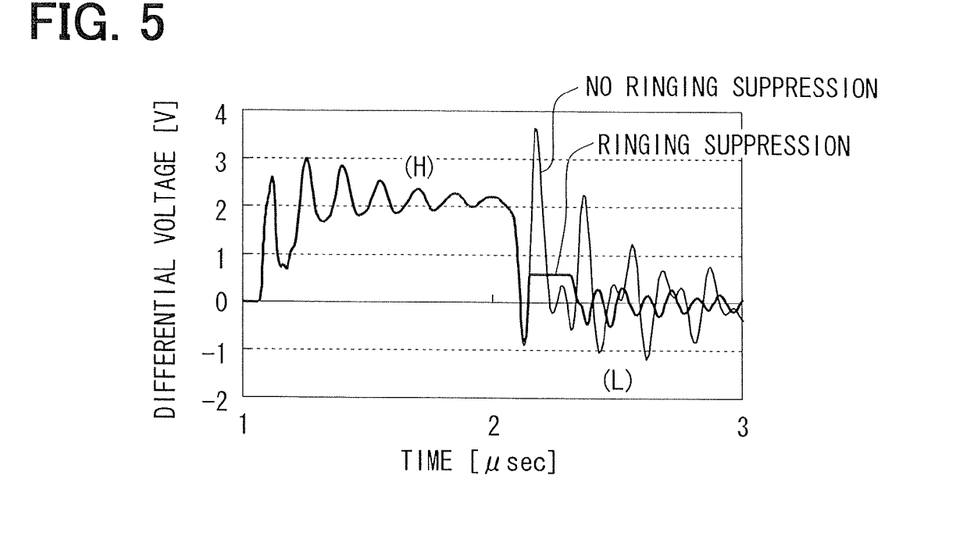
FIG. 5 is a waveform diagram showing examples of ringing, which arises when a transmission signal is switched from a high level to a low level, between cases where the ringing suppression circuit is provided and not provided.

When the potential of the high-side transmission line BP becomes higher than the potential of the low-side transmission line BM by more than a potential difference, which corresponds to the forward drop voltage of the diode 60, the diode 60 turns on. As a result, the impedance of the first control circuit 58 becomes as low as near zero. At this time, the potential of the high-side transmission line BP is clamped at a level, which is higher than the potential of the low-side transmission line BM by the forward drop voltage of the diode 60. FIG. 5 shows comparison of ringing, which are generated when the level of the transmission signal is switched over from the high level (H) to the low level (L), between cases, in which the ringing suppression circuit 46 is provided and not provided.

The function and advantage of the ringing suppression circuit 46 configured as above is described below. In the ringing suppression circuit 46, the first and the second transistors 52 and 56 connected in series are turned on at the same time for the predetermined time when the comparator circuit 48 detects the ringing. When the change of the ringing in the positive direction increases and the diode 60 of the first impedance control circuit turns on, the potential of the high-side transmission line BP is clamped at a level, which corresponds to the forward drop voltage of the diode 60. As a result, the peak wave level of the ringing in the positive direction is limited to the forward drop voltage of the diode 60. By thus setting the forward drop voltage of the diode 60 to be less than a level, at which the transmission signal of the high level is outputted, the change of the ringing in the positive direction can be suppressed to the predetermined wave peak level, which is less than the voltage level of the transmission signal of the high level.

The first control circuit 58 is connected operatively between the high-side transmission line BP and the low-side transmission line BM for only the predetermined time, when the ringing arises at the time of change of the transmission signal from the high level to the low level. Therefore, the limitation to the peak wave level in the positive direction of the ringing by the diode 60 is limited to be within a time period, in which the diode 60 will not impede generation of a high level signal when the high level signal is transmitted.

The resistor 62 is connected in parallel to the diode 60 in the first control circuit 58 of the ringing suppression circuit 46. By the resistor 62, the high-side transmission line BP and the low-side transmission line BM is operatively connected before the diode 60 turns on, that is, when the ringing has a change in the negative direction and a change of the ringing in the positive direction is less than the forward drop voltage of the diode 60. The matching impedance of the resistor 62 suppresses a large potential difference from developing between the high-side transmission line BP and the low-side transmission line BM. The ringing is thus reduced by the matching impedance as well.

The comparator circuit 48 in the ringing suppression circuit 46 continues to output the low level signal unless the potential of the high-side transmission line BP becomes more than the predetermined voltage higher than that of the low-side transmission line BM, once the potential of the low-side transmission line BM becomes higher than the potential of the high-side transmission line BP and outputs the low level signal. This predetermined voltage is set to be greater than the forward drop voltage of the diode 60. As a result, the first transistor 52 can be maintained in the on-state by the diode 60 while the peak wave level of the ringing in the positive direction is being limited. Further, the drive signal for turning off the second transistor 56 can be generated after the predetermined time delay. That is, it is prevented by the diode 60 of the first control circuit 58 that the switch circuit formed of the first and the second transistors 52 and 56 is turned off in the period of limiting the peak wave level in the positive direction of the ringing.

Second Embodiment

A differential communication device according to a second embodiment will be described next with reference to FIGS. 6 and 7. The differential communication device according to the second embodiment is different from that of the first embodiment only in a part of configuration of the ringing suppression circuits 46 and 46a.

Figure 6:
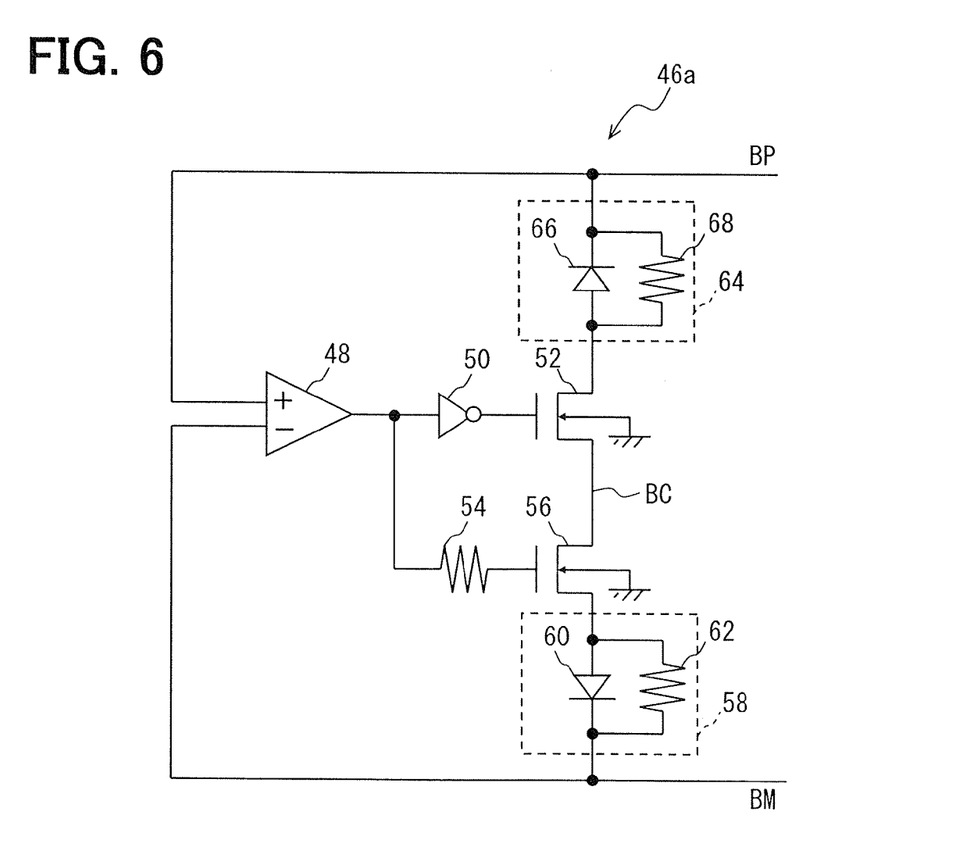
FIG. 6 is a circuit diagram of a ringing suppression circuit provided in a second embodiment.
Figure 7:
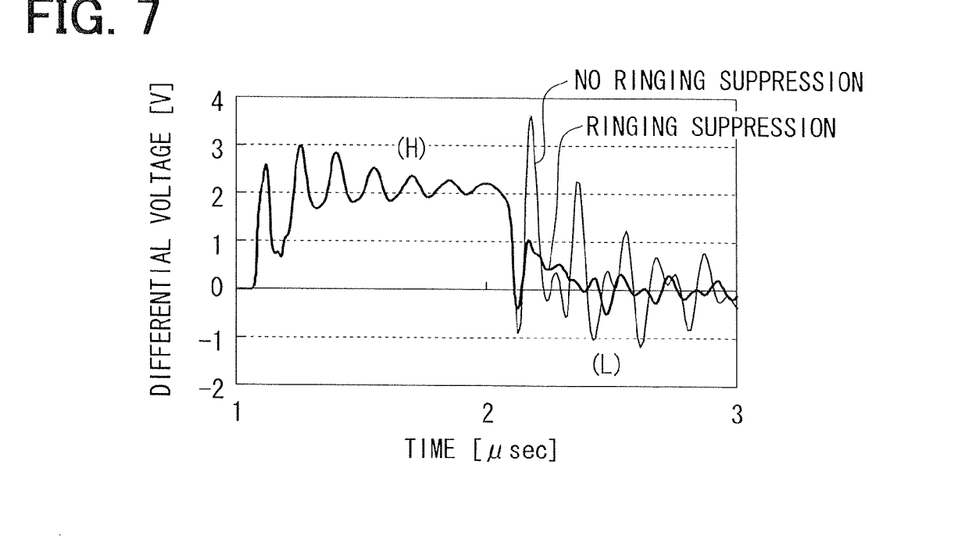
FIG. 7 is a waveform diagram showing examples of ringing, which arises when a transmission signal is switched from a high level to a low level, between cases where the ringing suppression circuit according to the second embodiment is provided and not provided.

As shown in FIG. 6, a ringing suppression circuit 46a has a second impedance control circuit (hereinafter second control circuit) 64 in series with the first control circuit 58 in the connection line BC, which connects the high-side transmission line BP and the low-side transmission line BM. The second control circuit 64 has a second diode 66 and a second resistor 68. The diode 66 is arranged such that its forward direction is from the low-side transmission line BM and the high-side transmission line BP. That is, the diode 66 is reverse-biased. The resistor 68 is connected in parallel to the diode 66.

The second control circuit 64 can thus suppress not only changes of ringing in the positive direction but also changes of ringing in the negative direction. As a result, the ringing can be suppressed advantageously.

More specifically, when a change arises in the negative direction of ringing, a current flows from the low-side transmission line BM to the high-side transmission line BP through the resistor 62 of the first control circuit 58 and the resistor 68 of the second control circuit 64 before the potential difference between the low-side transmission line BM and the high-side transmission line BP becomes higher than the forward drop voltage of the diode 66 of the second control circuit 64. This current varies in accordance with the potential difference. As a result, a large potential difference is suppressed by the matching impedances of the resistor 62 and the resistor 68 from developing between the low-side transmission line BM and the high-side transmission line BP. Generation of ringing is thus reduced.

The diode 66 turns on, when the potential difference between the low-side transmission line BM and the high-side transmission line BP becomes higher than the forward drop voltage of the diode 66 of the second control circuit 64. The current flows at this time through the resistor 62 of the first impedance control circuit and the diode 66 of the second control circuit 64. The potential of the low-side transmission line BM is clamped at a level, which is higher than the potential of the high-side transmission line BP by the forward drop voltage of the diode 66 and the voltage of the resistor 62. Thus, the peak wave level of the change in the negative direction of the ringing is limited to a level, which corresponds to the forward drop voltage of the diode 66 and the voltage of the resistor 62.

The configuration for suppressing the change in the positive direction of the ringing is generally the same as in the first embodiment. However, it is different in that the current flows through the resistor 68 of the second control circuit 64 when it flows from the high-side transmission line BP to the low-side transmission line BM.

Third Embodiment

A differential communication device according to a third embodiment is described next with reference to FIG. 8.

Figure 8:
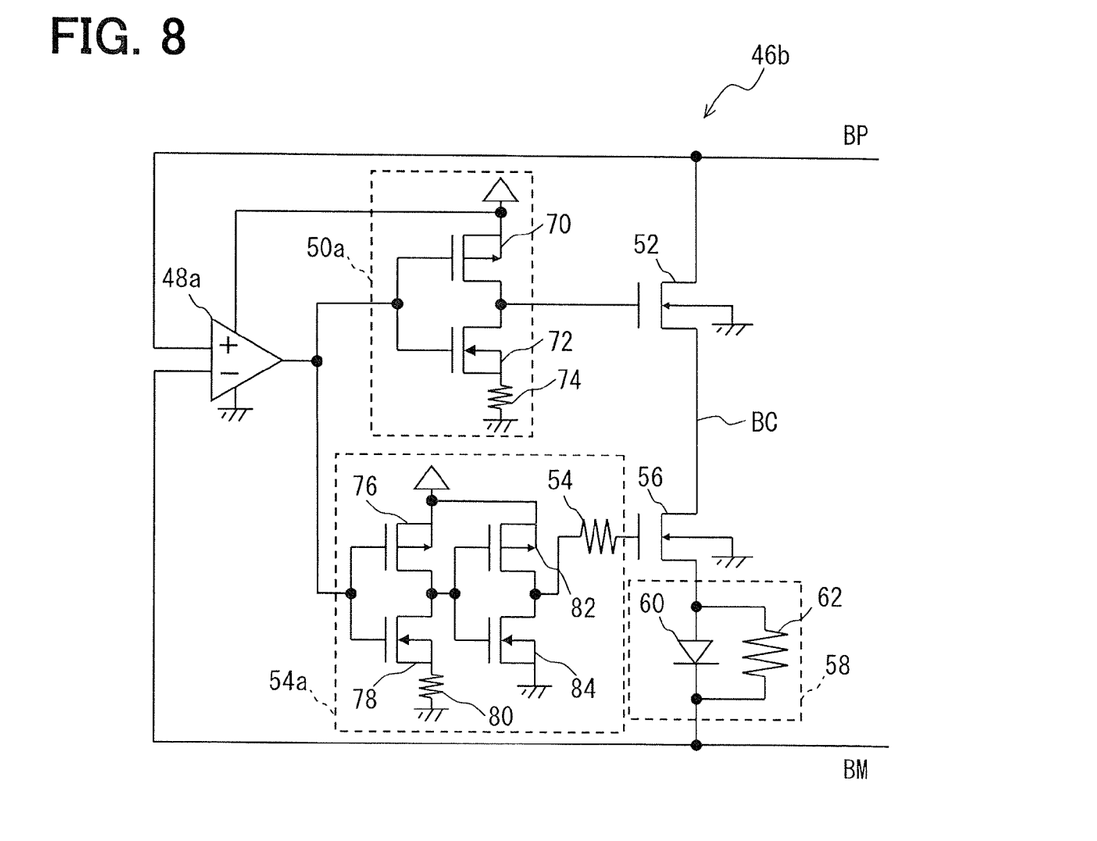
FIG. 8 is a circuit diagram of a ringing suppression circuit provided in a third embodiment.

A comparator circuit 48a shown in FIG. 8 is different from the comparator circuit 48 in that it has no hysteresis function. That is, the comparator circuit 48a simply outputs a high level output signal and a low level output signal, when the potential of the high-side transmission line BP is higher than that of the low-side transmission line BM and the potential of the low-side transmission line BM is higher than that of the high-side transmission line BP, respectively.

The comparator circuit 48a thus outputs the high level signal when the change arises in the positive direction in the ringing. An inverter circuit 50a is configured not to turn off the first transistor 52 immediately in response to the high level signal. That is, the inverter circuit 50a is formed as a CMOS inverter circuit of a pMOS 70 and a nMOS 72 and has a resistor 74 between the nMOS 72 and the ground.

When a change arises in the positive direction in the ringing and the comparator circuit 48a outputs the high level signal, the pMOS 70 and the nMOS 72 in the inverter circuit 50a are turned off and on, respectively. As a result, the gate of the first transistor 52 is grounded through the nMOS 72 and the resistor 74.

However, the resistor 74 is provided in a path, by which the gate of the first transistor 52 is grounded. The gate potential of the first transistor 52 therefore does not fall to the ground potential immediately because of a delay operation of the resistor 74 and remains high for a predetermined time. This predetermined time is set to be longer than a ringing period (½ of one cycle of ringing) by the resistor 74. Thus, even when the magnitude of ringing changes from the negative side to the positive side at the time of development of ringing and the output signal of the comparator circuit 48a changes to the high level, the output signal of the comparator circuit 48a changes to the low level before the high level signal turns off the first transistor 52. Therefore, it is prevented that the first transistor 52 is turned off within a period, in which the peak wave level in the positive direction in the ringing need be limited.

In addition, a delay circuit 54a is provided in a ringing suppression circuit 46b and configured such that the second transistor 56 is turned off after a predetermined time from first detection of development of ringing by the comparator circuit 48a.

Specifically, the delay circuit 54a is formed of two-stages of inverter circuits and the resistor 54. A resistor 80 is provided between a NMOS 78 of the first stage inverter circuit and the ground.

As a result, when the ringing develops a change in the positive direction and the comparator circuit 48a outputs the high level signal, the pMOS 76 and the nMOS 78 of the first stage inverter is turned off and turned on, respectively. The gates of the pMOS 82 and the nMOS 84 of the second stage inverter circuit are grounded through the nMOS 78 and the resistor 80.

However, the gate potentials of the pMOS 82 and the nMOS 84 of the second stage inverter circuit does not fall to the ground potential immediately because of a delay operation of the resistor 80 and remains high for a predetermined time. This predetermined time is set to be longer than a period of the ringing by a resistance of the resistor 80. Thus, even when the magnitude of ringing changes from the negative side to the positive side at the time of development of ringing and the output signal of the comparator circuit 48a changes to the high level, the output signal of the comparator circuit 48a changes to the low level before the high level signal changes the output of the second stage inverter.

As a result, the output of the second stage inverter is maintained at the low level from the time when the output signal of the comparator circuit 48a is changed to the low level for the first time because of development of a change in the negative direction in the ringing. The second transistor 56 accordingly turns off after the predetermined time, which is determined by the delay operation of the resistor 54.

Figure 9:
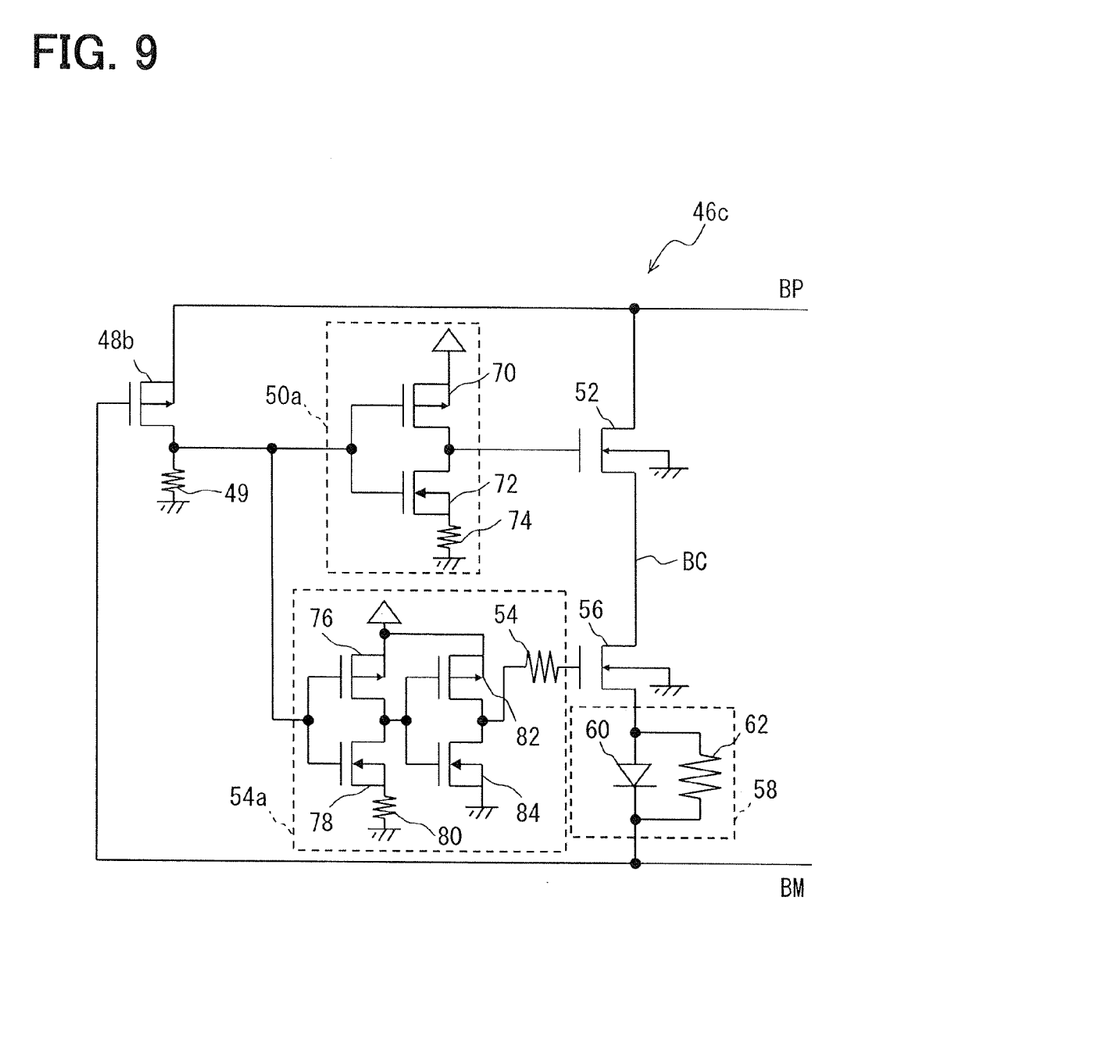
FIG. 9 is a circuit diagram of a modified ringing suppression circuit provided in the third embodiment.

It is noted that the comparator circuit 48a having no hysteresis function may be formed of a pMOS transistor 48b and a resistor 49 as shown in FIG. 9. A ringing suppression circuit 46c is configured as a modified example of the ringing suppression circuit 46b.

According to the example shown in FIG. 8, the delay circuit 54a has the two-stage inverter circuit. However, the number of stages of the inverter circuit is not limited to be two as far as it is plural. In this case, by connecting the resistor 80 to a stage of the inverter circuit other than the final stage, the output of the final stage of the inverter circuit can be maintained even when the level of the output signal of the comparator circuit 48a is changed.

Fourth Embodiment

A differential communication device according to a fourth embodiment will be described with reference to FIG. 10, which shows a ringing suppression circuit 46d in the differential communication device.

The ringing suppression circuit 46d is configured to detect that the transmission signal, which is transmitted by the two transmission lines BP and BM, is changed from the high level to the low level only after detection of transmission of the high level signal by the two transmission lines BP and BM.

Figure 10:
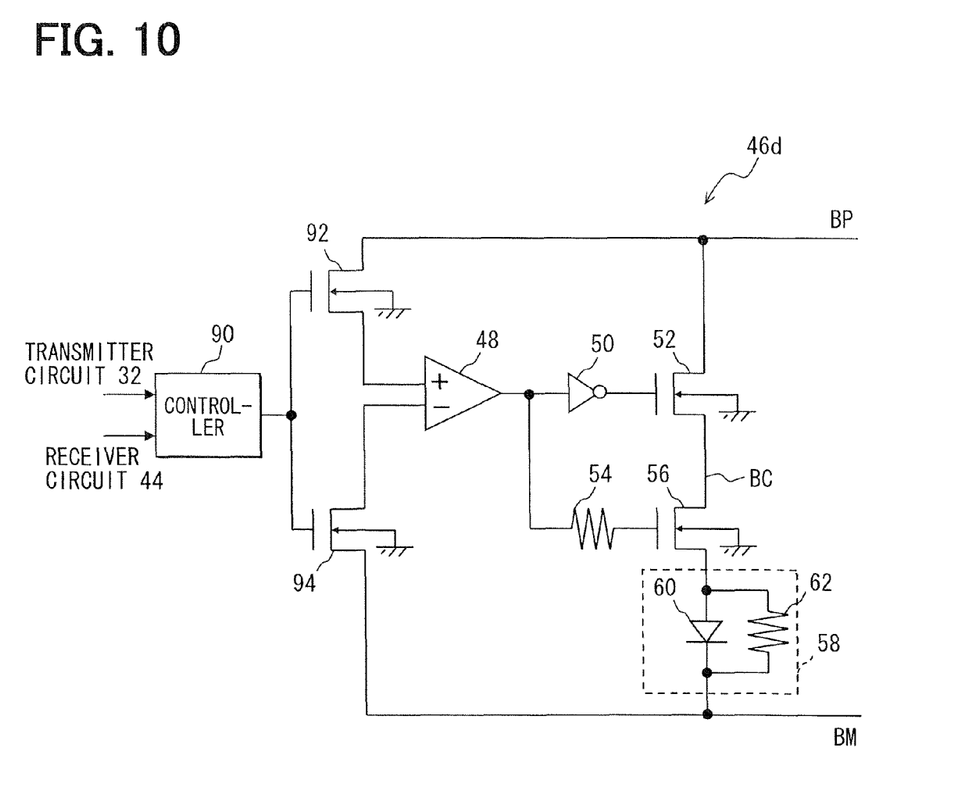
FIG. 10 is a circuit diagram of a ringing suppression circuit provided in a fourth embodiment.

Specifically, the ringing suppression circuit 46d is connected to the transmitter circuit 32 and the receiver circuit 44 through a controller 90 provided as a high level signal detection circuit, a first switch 92 and a second switch 94 as shown in FIG. 10. The controller 90 is provided to detect that the high level signal has been transmitted by the two transmission lines BP and BM based on transmission of the high level signal by the transmitter circuit 32 and reception of the high level signal by the receiver circuit 44.

Upon detection of transmission of the high level signal by the two transmission lines BP and BM, the controller 90 turns on both the first switch 92, which is provided between the high-side transmission line BP and the comparator circuit 48, and the second switch 94, which are provided between the low-side transmission line BM and the comparator circuit 48. Thus, the potential of the high-side transmission line BP and the potential of the low-side transmission line BM are applied to the comparator circuit 48. As a result, it becomes possible to detect the ringing by the comparator circuit 48 and operate the ringing suppression circuit 46d.

According to the fourth embodiment, the ringing suppression circuit 46d is operated only after detection of the transmission of the high level signal by the two transmission lines BP and BM. As a result, the ringing suppression circuit 46d is prevented from operating erroneously in response to disturbance in a differential voltage, which is caused by external noise, or ringing, which is caused when the transmission signal rises high.

The present invention described with reference to the preferred embodiments is not limited to such embodiments, but may be implemented in different modified forms.

For example, the second control circuit 64 in the second embodiment may be provided in the third and the fourth embodiments. The ringing suppression circuit, which is operated only when the high level transmission signal is detected as described in the fourth embodiment, may be provided in the other embodiments as well.

The first control circuit 58 may be formed of only a resistor.

What is claimed is:

1. A differential communication device for switching over a level of a transmission signal to either a high level or a low level in accordance with a potential difference between two transmission lines, the differential communication device comprising:

a communication circuit connected to the transmission lines and including at least one of a transmitter circuit for transmitting the transmission signal and a receiver circuit for receiving the transmission signal; and a ringing suppression circuit connected to the transmission lines in parallel to the communication circuit, wherein the ringing suppression circuit includes a first control circuit, a switch circuit and a drive signal output circuit, the first control circuit provided in a connection line connecting the two transmission lines and including a first diode, which is arranged such that a forward direction thereof is from a high-side transmission line of the two transmission lines to a low-side transmission line of the two transmission lines, the high-side transmission line and the low-side transmission line providing a relatively high potential and a relatively low potential in case of transmission of a high level signal, respectively, the switch circuit provided in the connection line in a series relation with the first diode, and the drive signal output circuit outputting a drive signal, which turns on the switch circuit for only a predetermined time, upon detection of a change of the transmission signal from the high level to the low level.

2. The differential communication device according to claim 1, wherein:

the first control circuit includes a first resistor, which is provided in parallel with the first diode.

3. The differential communication device according to claim 2, further comprising:

a second control circuit connected in a series relation with the first control circuit in the connection line and including a second diode and a second resistor, which are connected in parallel to each other, wherein the second diode is arranged such that a forward direction thereof is from the low-side transmission line to the high-side transmission line.

4. The differential communication device according to claim 1, wherein:

the drive signal output circuit is configured to detect the change of the level of the transmission signal from the high level to the low level, when a potential of the low-side transmission line exceeds a potential of the high-side transmission line.

5. The differential communication device according to claim 1, wherein:
the switch circuit includes a first switching element and a second switching element connected in series with each other in the connection line;
the drive signal output circuit includes a phase inversion circuit and a delay circuit, the phase inversion circuit provided for the first switching element to output a drive signal opposite in phase from that of the second switching element, and the delay circuit provided for the second switching element to delay application of the drive signal to the second switching element; and
the drive signal output circuit is configured to output the drive signal for turning off the first switching element and turning on the second switching element before detection of the change in the level of the transmission signal from the high level to the low level, and switch over the drive signal for turning on the first switching element and turning off the second switching element upon detection of the change in the level of the transmission signal from the high level to the low level.

6. The differential communication device according to claim 5, wherein:
the drive signal output circuit includes a comparator circuit, which compares the potential of the low-side transmission line and the potential of the high-side transmission line for switching over the drive signal based on a comparison result;
the comparator circuit is configured to maintain the comparison result indicating that the potential of the low-side transmission line is higher than the potential of the high-side transmission line unless the potential of the high-side transmission line becomes more than a predetermined voltage higher than the potential of the low-side transmission line, once the potential of the low-side transmission line has become higher than the potential of the high-side transmission line; and
the predetermined voltage is set to be greater than a forward drop voltage of the first diode.

7. The differential communication device according to claim 5, wherein:
the drive signal output circuit includes a comparator circuit, which compares the potential of the low-side transmission line and the potential of the high-side transmission line for switching over the drive signal based on a comparison result;
the comparator circuit is configured to output a drive signal, which turns on the first switching element and turns off the second switching element, when the potential of the low-side transmission line becomes higher than the potential of the high-side transmission line;
the comparator circuit is configured to output a drive signal, which turns off the first switching element and turns on the second switching element, when the potential of the high-side transmission line becomes higher than the potential of the low-side transmission line; and
the phase inversion circuit has a function of delaying the drive signal, which turns off the first switching element, for a delay time set to be longer than a period of ringing.

8. The differential communication device according to claim 7, wherein: the delay circuit includes a plurality of stages of inverter circuits having a function of delaying the drive signal, which turns on the second switching element, for a delay time set to be longer than the period of ringing.

9. The differential communication device according to claim 1, further comprising:
a high level signal detection circuit for detecting transmission of the high level signal by the transmission lines and allowing the drive signal output circuit to detect a switch-over of the transmission signal from the high level to the low level only after detection of the transmission of the high level signal.

* * * * *